(12) United States Patent
Liu et al.

(10) Patent No.: US 11,990,460 B2
(45) Date of Patent: May 21, 2024

(54) SEMICONDUCTOR DEVICE

(71) Applicants: KABUSHIKI KAISHA TOSHIBA, Tokyo (JP); Toshiba Electronic Devices & Storage Corporation, Tokyo (JP)

(72) Inventors: Jia Liu, Yokohama (JP); Masahiko Hori, Yokohama (JP)

(73) Assignees: KABUSHIKI KAISHA TOSHIBA, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 41 days.

(21) Appl. No.: 17/651,450

(22) Filed: Feb. 17, 2022

(65) Prior Publication Data

US 2023/0089737 A1 Mar. 23, 2023

(30) Foreign Application Priority Data

Sep. 21, 2021 (JP) ................. 2021-152824

(51) Int. Cl.
| | |
|---|---|
| *H01L 25/16* | (2023.01) |
| *H01L 23/31* | (2006.01) |
| *H01L 23/538* | (2006.01) |
| *H01L 23/66* | (2006.01) |
| *H01L 31/12* | (2006.01) |

(52) U.S. Cl.
CPC ........ *H01L 25/167* (2013.01); *H01L 23/3121* (2013.01); *H01L 23/5386* (2013.01); *H01L 23/66* (2013.01); *H01L 31/12* (2013.01)

(58) Field of Classification Search
CPC ... H01L 25/16; H01L 25/167; H01L 23/3121; H01L 23/5386; H01L 23/66; H01L 31/12; H01L 31/167; H04B 10/40
See application file for complete search history.

(56) References Cited

U.S. PATENT DOCUMENTS

| | | | |
|---|---|---|---|
| 9,171,969 B2 | 10/2015 | Yamamoto et al. | |
| 2020/0161494 A1* | 5/2020 | Fujihara | .......... H01L 24/49 |
| 2020/0274020 A1* | 8/2020 | Jiang | .......... G01J 1/0233 |
| 2022/0344896 A1* | 10/2022 | Eto | .......... H01S 5/02315 |

FOREIGN PATENT DOCUMENTS

| | | |
|---|---|---|
| JP | 2003-84173 A | 3/2003 |
| JP | 2005-123274 A | 5/2005 |
| JP | 5985452 B2 | 9/2016 |

* cited by examiner

*Primary Examiner* — Calvin Y Choi
(74) *Attorney, Agent, or Firm* — Maier & Maier, PLLC

(57) ABSTRACT

According to one embodiment, a semiconductor device includes: a substrate that has a first surface extending in a first direction and a second direction; a first metal oxide semiconductor field effect transistor (MOSFET) that is provided on the first surface of the substrate; a support base that is provided above the first surface of the substrate and extends in a third direction intersecting the first direction and the second direction; a light receiving element that is in contact with a second surface of the support base facing the first direction; and a light emitting element that is in contact with a third surface of the light receiving element facing the first direction.

13 Claims, 7 Drawing Sheets

SEMICONDUCTOR DEVICE

CROSS-REFERENCE TO RELATED APPLICATIONS

This application is based upon and claims the benefit of priority from Japanese Patent Application No. 2021-152824, filed Sep. 21, 2021, the entire contents of which are incorporated herein by reference.

FIELD

Embodiments described herein relate generally to a semiconductor device

BACKGROUND

A photo relay device is known as a semiconductor device. The photo relay device is a semiconductor relay device including a light emitting element and a light receiving element. The photo relay device is a contactless relay, and is used for transmission of an AC signal or a DC signal.

DETAILED DESCRIPTION

Figure 1:
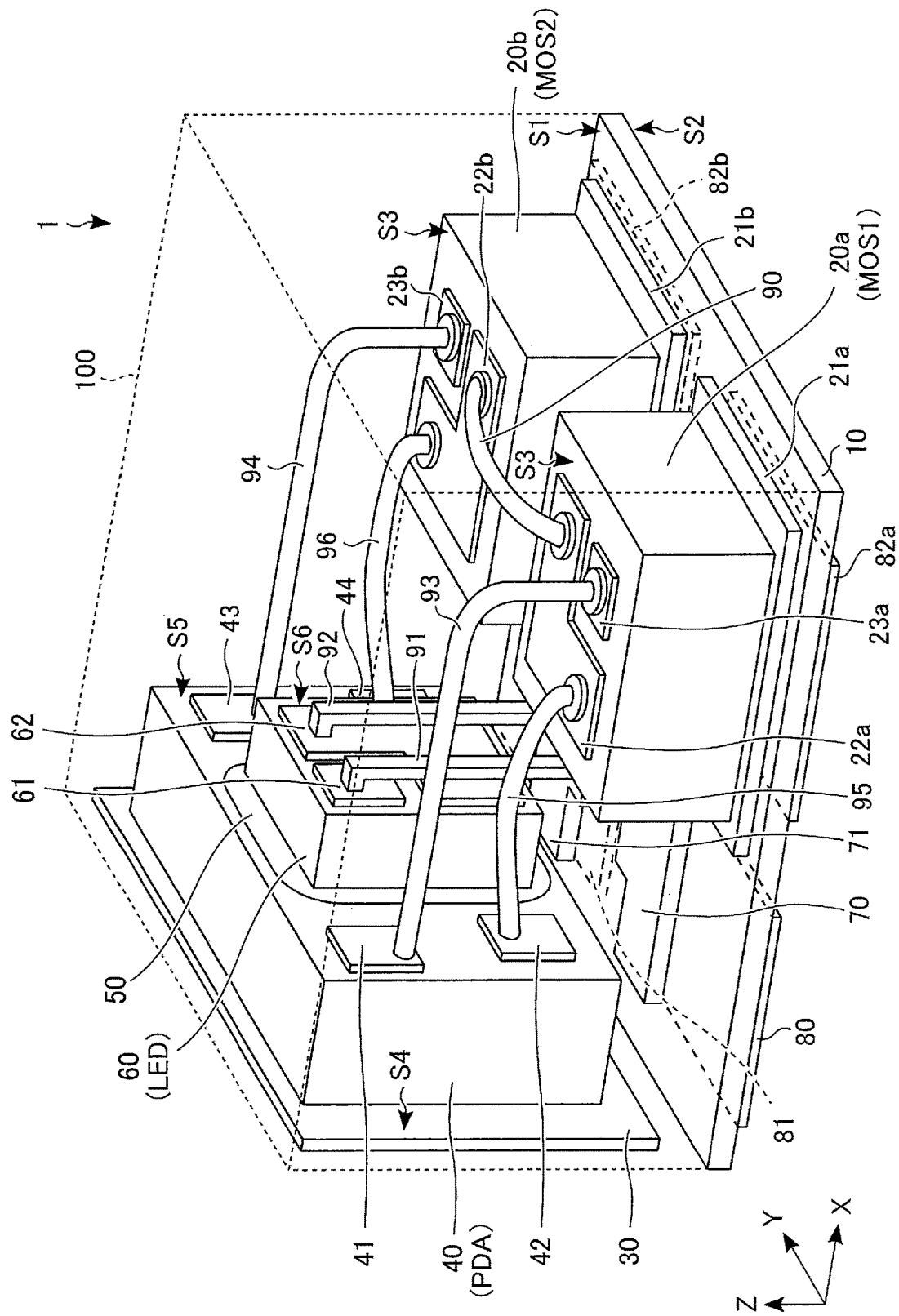
FIG. 1 is a perspective view of a photo relay device according to a first embodiment.

In general, according to one embodiment, a semiconductor device includes: a substrate that has a first surface extending in a first direction and a second direction; a first metal oxide semiconductor field effect transistor (MOSFET) that is provided on the first surface of the substrate; a support base that is provided above the first surface of the substrate and extends in a third direction intersecting the first direction and the second direction; a light receiving element that is in contact with a second surface of the support base facing the first direction; and a light emitting element that is in contact with a third surface of the light receiving element facing the first direction.

Hereinafter, embodiments will be described with reference to the drawings. In the following description, components having substantially the same function and configuration are denoted by the same reference numerals, and repeated description may be omitted. In addition, all the descriptions of an embodiment are also applied to the description of another embodiment, unless expressly or explicitly excluded.

In the present specification and claims, when a first element is "coupled" to another second element, it includes that the first element is coupled to the second element directly or constantly or selectively via an element that is conductive.

1. First Embodiment

A first embodiment will be described. In the present embodiment, a photo relay device will be described as an example of a semiconductor device.

1.1 Overall Configuration

Figure 2:
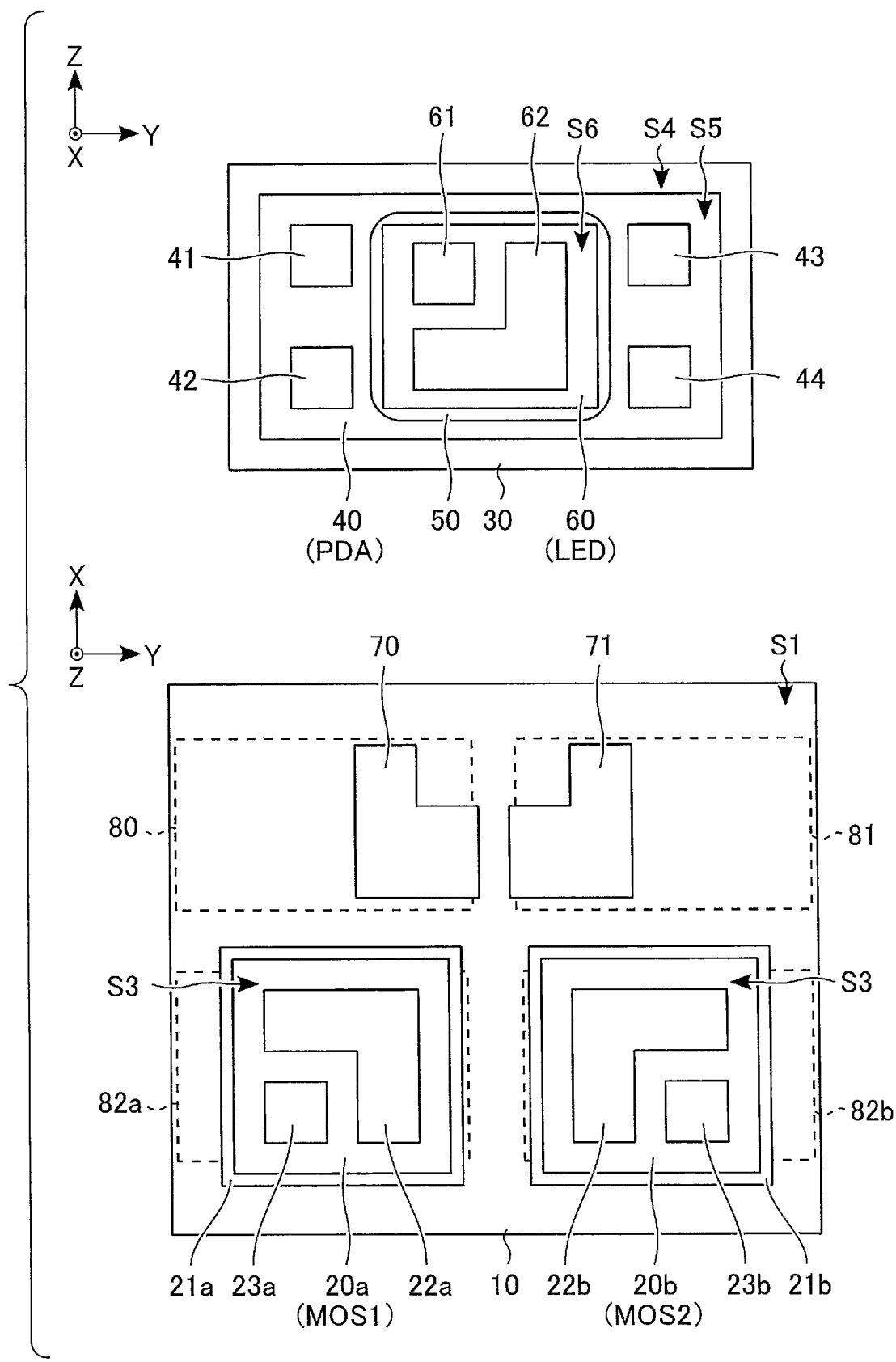
FIG. 2 is a diagram illustrating a plane of a substrate and a plane of a support base in the photo relay device according to the first embodiment.

First, an example of an overall configuration of a photo relay device 1 will be described with reference to FIGS. 1 and 2. FIG. 1 is a perspective view of the photo relay device 1. FIG. 2 is a diagram illustrating a plane of a substrate 10 and a plane of a support base 30 in the photo relay device 1. In the following description, a direction parallel to a substrate 10 of the photo relay device 1 is defined as an X direction. A direction parallel to the substrate 10 and intersecting the X direction is defined as a Y direction. A direction perpendicular to the substrate 10 (intersecting the substrate 10) and intersecting the X direction and the Y direction is defined as a Z direction (or referred to as a "longitudinal direction"). Note that, in FIG. 2, in order to simplify the description, wires coupling electrodes are omitted.

As illustrated in FIGS. 1 and 2, the photo relay device 1 includes a substrate 10, two metal oxide semiconductor field effect transistors (MOSFETs) 20a and 20b, a support base 30, a light receiving element 40, a light emitting element 60, electrodes 70 and 71, input terminals 80 and 81, output terminals 82a and 82b, wires 90 to 96, and a sealing resin 100.

The substrate 10 is, for example, a flexible printed circuit (FPC) using polyimide. Note that the substrate 10 is not limited to the flexible printed circuit. The substrate 10 has, for example, a plate shape extending in the X direction and the Y direction.

The MOSFETs 20a and 20b are, for example, enhancement type n-channel MOS transistors. The MOSFETs 20a and 20b are used to control an AC signal or a DC signal to be transmitted. When the MOSFETs 20a and 20b are turned on, the photo relay device 1 transmits a signal, and when the MOSFETs 20a and 20b are turned off, the photo relay device 1 does not transmit a signal.

The MOSFET 20a (hereinafter, also referred to as "MOS1") includes electrodes 21a, 22a, and 23a. The electrode 21a functions as a drain electrode of the MOSFET 20a. The electrode 22a functions as a source electrode of the MOSFET 20a. The electrode 23a functions as a gate electrode of the MOSFET 20a. The electrode 21a is provided on a surface S1 of the substrate 10 facing the Z direction. That is, the electrode 21a can also be referred to as a die pad provided on the surface S1 of the substrate 10. The MOSFET 20a is provided on the electrode 21a. An electrode 22a and an electrode 23a are provided on a surface S3 facing the Z direction opposite to a surface in contact with the electrode 21a of the MOSFET 20a.

The MOSFET 20b (hereinafter, also referred to as "MOS2") has the same structure as the MOSFET 20a. For example, the MOSFET 20b is disposed side by side with the MOSFET 20a in the Y direction above the surface S1 of the substrate 10. Note that the arrangement of the MOSFET 20a and the MOSFET 20b is arbitrary.

The MOSFET 20b includes electrodes 21b, 22b, and 23b. The electrode 21b functions as a drain electrode of the MOSFET 20b. The electrode 22b functions as a source electrode of the MOSFET 20b. The electrode 23b functions as a gate electrode of the MOSFET 20b. The electrode 21b is provided on the surface S1 of the substrate 10 facing the Z direction. That is, the electrode 21b can also be referred to as a die pad provided on the surface S1 of the substrate 10. The MOSFET 20b is provided on the electrode 21b. An electrode 22b and an electrode 23b are provided on a surface S3 facing the Z direction facing a surface in contact with the electrode 21b of the MOSFET 20b. In the example of FIG. 2, the electrode 22b and the electrode 23b are disposed symmetrically with the electrode 22a and the electrode 23a of the MOSFET 20a with the X direction as a center axis.

The electrode 22a of the MOSFET 20a and the electrode 22b of the MOSFET 20b are commonly coupled by a wire 90. That is, the source of the MOSFET 20a and the source of the MOSFET 20b are commonly coupled. Note that the number of wires 90 may be one or more.

The support base 30 supports the light receiving element 40 and the light emitting element 60. The support base 30 may be a conductor or an insulator. The support base 30 has a plate shape extending in the Y direction and the Z direction. The support base 30 is disposed in the longitudinal direction (the perpendicular or Z direction) with respect to the surface S1 of the substrate 10, for example.

The light receiving element 40 is a photo diode array (PDA), a phototransistor, or the like. Hereinafter, a case where the light receiving element 40 is the PDA will be described. The light receiving element 40 is in contact with a surface S4 of the support base 30 facing the X direction. More specifically, the surface S4 of the support base 30 faces the side on which the MOSFETs 20a and 20b are disposed in the X direction. The light receiving element 40 is disposed in the longitudinal direction with respect to substrate 10. The light receiving element 40 has a light receiving surface on a surface S5 facing the X direction opposite to a surface in contact with the support base 30. In other words, the surface S5 of the light receiving element 40 faces the side on which the MOSFETs 20a and 20b are disposed in the X direction. The light receiving element 40 includes electrodes 41 to 44. The electrodes 41 to 44 are provided on the surface S5 facing the X direction opposite to a surface of the light receiving element 40 in contact with the support base 30. For example, the electrodes 41 and 43 are commonly coupled in the light receiving element 40. For example, the electrodes 42 and 44 are commonly coupled in the light receiving element 40. The electrode 41 is coupled to the electrode 22a of the MOSFET 20a via the wire 93. The electrode 42 is coupled to the electrode 23a of the MOSFET 20a via the wire 95. The electrode 43 is coupled to the electrode 22b of the MOSFET 20b via the wire 94. The electrode 44 is coupled to the electrode 23b of the MOSFET 20b via the wire 96.

The light emitting element 60 is, for example, a light emitting diode (LED). The light emitting element 60 is disposed on the surface S5 of the light receiving element 40 with an adhesive layer 50 interposed therebetween. The light emitting element 60 is disposed in the longitudinal direction with respect to the substrate 10. Note that an insulating material having a light transmitting property is used for the adhesive layer 50. A light irradiation surface of the light emitting element 60 faces the light receiving surface of the light receiving element 40, that is, the surface S5 of the light receiving element 40. The light emitting element 60 includes electrodes 61 and 62. The electrodes 61 and 62 are provided on a surface S6 facing the X direction opposite to a surface of the light emitting element 60 in contact with the light receiving element 40. In other words, the surface S6 of the light emitting element 60 faces the side on which the MOSFETs 20a and 20b are disposed in the X direction. One of the electrodes 61 and 62 is an anode electrode of the light emitting element 60, and the other is a cathode electrode of the light emitting element 60.

The electrodes 70 and 71 are provided on the surface S1 of the substrate 10. The electrode 70 is coupled to the electrode 61 of the light emitting element 60 via the wire 91. The electrode 71 is coupled to the electrode 62 of the light emitting element 60 via the wire 92. The wire 91 extends, for example, in the Z direction, and has one end coupled to the electrode 61 and the other end coupled to the electrode 70. Similarly, the wire 92 extends, for example, in the Z direction, and has one end coupled to the electrode 62 and the other end coupled to the electrode 71.

The input terminals 80 and 81 and the output terminals 82a and 82b are provided on the surface S2 opposite to the surface S1 of the substrate 10.

The input terminals 80 and 81 are coupled to a DC power supply (not illustrated in the drawings) provided outside. A voltage for controlling the photo relay device 1 is applied to the input terminals 80 and 81. The input terminal 80 is electrically coupled to the electrode 70 via a conductor (not illustrated in the drawings) penetrating the substrate 10. The input terminal 81 is electrically coupled to the electrode 71 via a conductor (not illustrated in the drawings) penetrating the substrate 10.

The output terminals 82a and 82b are coupled to circuits or the like provided outside. The output terminal 82a is electrically coupled to the electrode 21a of the MOSFET 20a via a conductor penetrating the substrate 10. The output terminal 82b is electrically coupled to the electrode 21b of the MOSFET 20b via a conductor penetrating the substrate 10. When the MOSFETs 20a and 20b are turned on, the output terminals 82a and 82b are electrically coupled. As a result, an AC or DC signal is transmitted via the photo relay device 1.

The wires 90 to 96 are made of a conductive material. Note that each of the wires 91 to 96 may be a wire formed by wire bonding or a wire of a flexible printed circuit.

The sealing resin 100 covers and protects the MOSFETs 20a and 20b, the light receiving element 40, the light emitting element 60, and the wires 90 to 96 disposed above the surface S1 of the substrate 10. Further, the sealing resin 100 fixes the positions of the support base 30, the light receiving element 40, and the light emitting element 60 disposed in the longitudinal direction. Note that the sealing resin 100 may include a plurality of resin materials. For example, the sealing resin 100 may include a first sealing resin covering the light emitting element 60 and a second sealing resin covering the entire upper portion of the surface S1 of the substrate 10.

1.2 Cross-Sectional Configuration of Photo Relay Device

Figure 3:
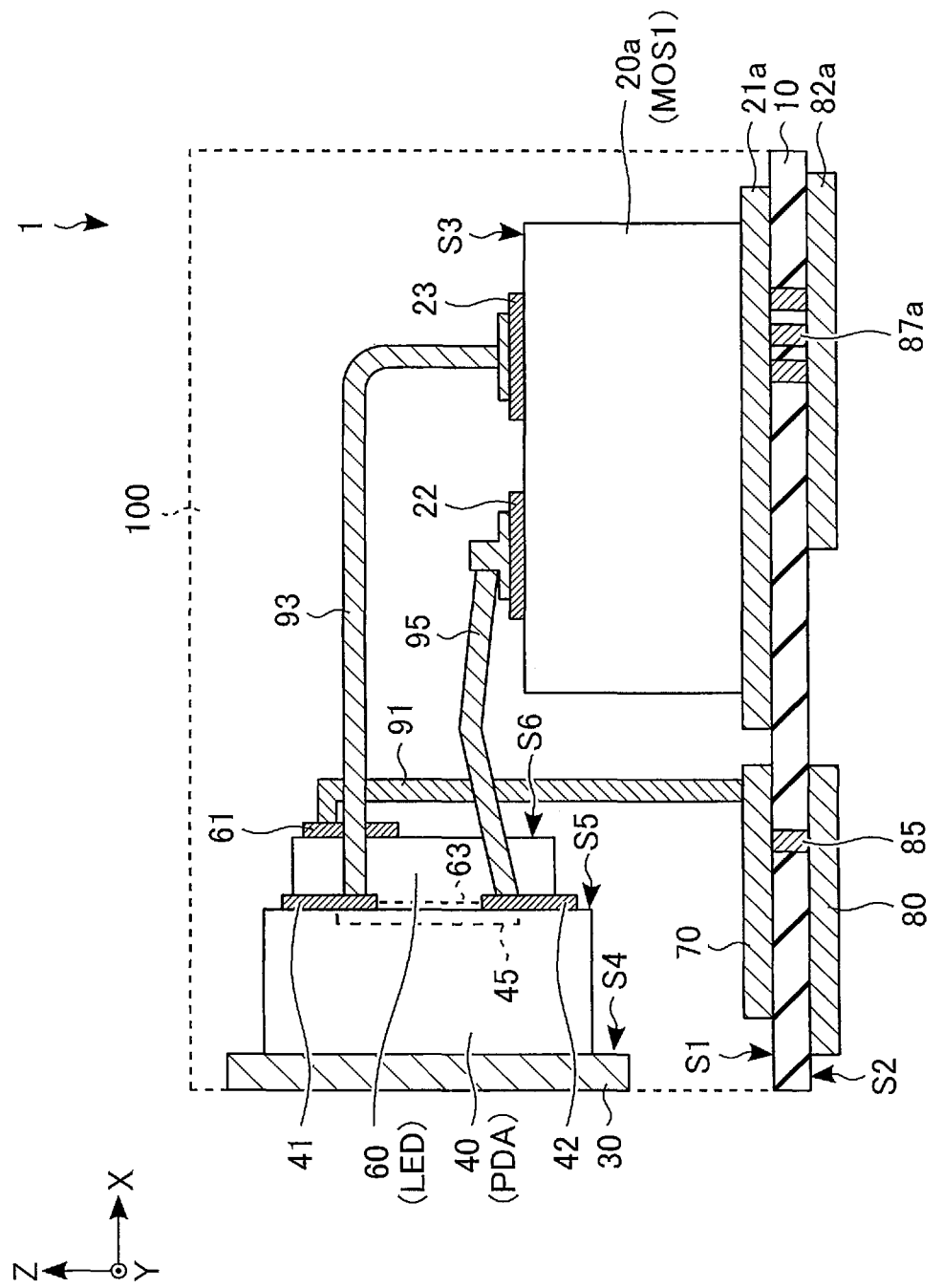
FIG. 3 is a cross-sectional view of the photo relay device according to the first embodiment.

Next, an example of a cross-sectional configuration of the photo relay device 1 will be described with reference to FIG. 3. FIG. 3 is a cross-sectional view of the photo relay device when viewed from a side surface facing the Y direction.

As illustrated in FIG. 3, the light receiving element 40 and the light emitting element 60 are stacked on the surface S3 of the support base 30 in the X direction. A stacked structure of the support base 30, the light receiving element 40, and the light emitting element 60 is disposed above the surface S1 of the substrate 10. In addition, the surface S4 of the support base 30, the surface S5 of the light receiving element 40, and the surface S6 of the light emitting element 60 face the side on which the MOSFETs 20a and 20b are disposed in the X direction. The stacked structure of the support base 30, the light receiving element 40, and the light emitting element 60 is disposed in the longitudinal direction with respect to the substrate 10 and the MOSFETs 20a and 20b.

The light receiving surface 45 of the light receiving element 40 is provided on the surface S5 of the light receiving element 40. The light irradiation surface 63 of the light emitting element 60 faces the light receiving surface of the light receiving element 40, that is, the surface S5 of the light receiving element 40.

The electrode 70 is electrically coupled to the input terminal 80 via a conductor 85 penetrating the substrate 10. The same is applied to coupling between the electrode 71 and the input terminal 81.

The electrode 21a of the MOSFET 20a is electrically coupled to the output terminal 82a via a conductor 87a penetrating the substrate 10. Note that, in the example of FIG. 3, three conductors 87a are provided, but one or more conductors 87a may be provided. The same is applied to coupling between the electrode 21b of the MOSFET 20b and the output terminal 82b.

By disposing the light receiving element 40 and the light emitting element 60 in the longitudinal direction, the distances between the electrodes 41 to 44 of the light receiving element 40 and the electrodes 22a, 22b, 23a, and 23b of the MOSFETs 20a and 20b can be shortened as compared with a case where the light receiving element 40 and the light emitting element 60 are disposed beside the MOSFETs 20a and 20b. That is, the lengths of the wires 93 to 96 can be relatively shortened. Similarly, the lengths of the wires 91 and 92 coupled to the electrodes 61 and 62 of the light emitting element 60 and the electrodes 70 and 71 provided on the substrate 10 can be relatively shortened.

Note that, in the example of FIG. 3, the support base 30 is provided above the surface S1 of the substrate 10 and is not in contact with the substrate 10, but may extend in the Z direction to be in contact with the substrate 10.

1.3 Circuit Configuration of Photo Relay Device

Figure 4:
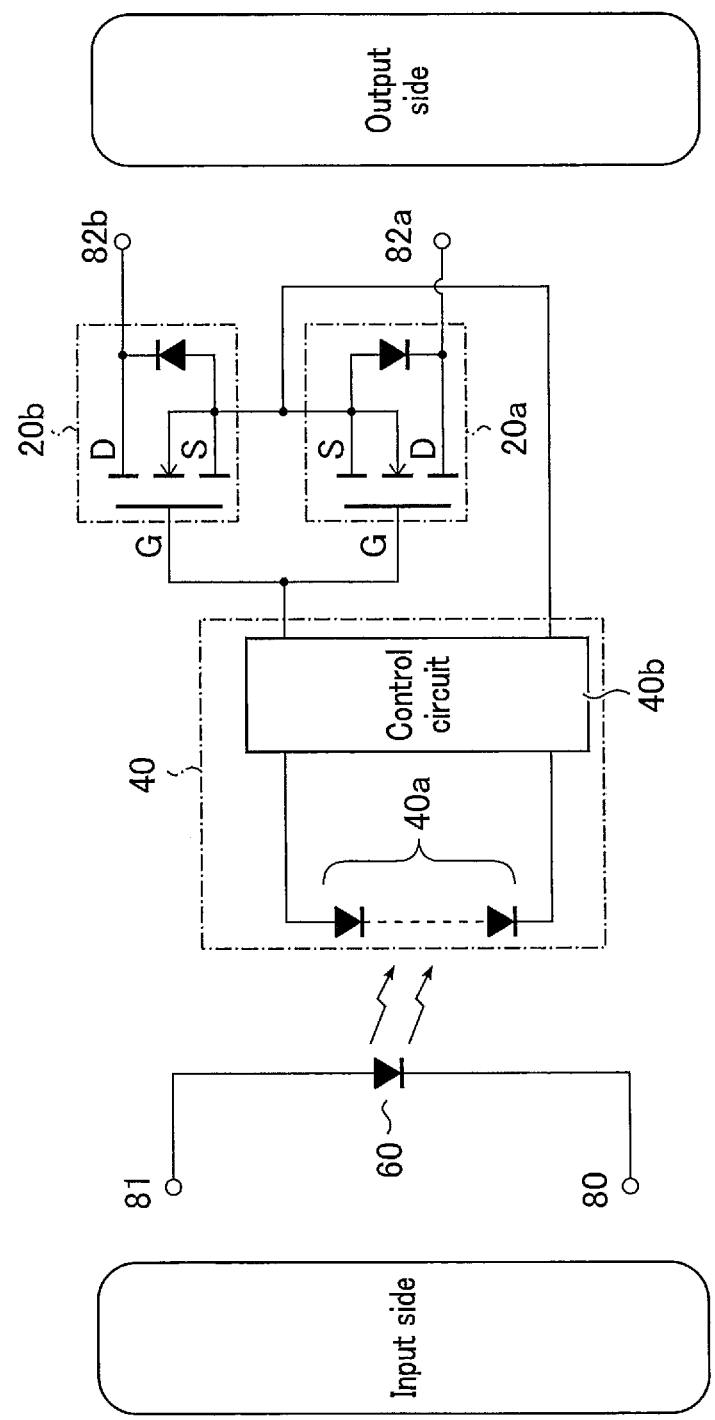
FIG. 4 is a circuit diagram of the photo relay device according to the first embodiment.

Next, an example of a circuit configuration of the photo relay device 1 will be described with reference to FIG. 4. FIG. 4 is a circuit diagram of the photo relay device 1.

As illustrated in FIG. 4, the light emitting element 60 is coupled to the input terminals 80 and 81. An input voltage for controlling the photo relay device 1 is applied to the input terminals 80 and 81.

The light receiving element 40 is, for example, a photodiode array including several to several tens of photodiodes 40a coupled in series and a control circuit 40b. Both ends of the plurality of photodiodes 40a coupled in series are coupled to the control circuit 40b.

The gates of the MOSFETs 20a and 20b are commonly coupled to the anode of the light receiving element 40. The sources of the MOSFETs 20a and 20b are commonly coupled to the cathode of the light receiving element 40. The drain of the MOSFET 20a is coupled to the output terminal 82a. The drain of the MOSFET 20b is coupled to the output terminal 82b.

When, in an input-side, the light emitting element 60 is turned on (light emitting state), the light receiving element 40 that drives the MOSFETs 20a and 20b receives light from the light emitting element 60 and generates a voltage of, for example, 7 V to several ten V. As a result, in an output-side, the MOSFETs 20a and 20b are turned on, and the output terminals 82a and 82b are electrically coupled. Further, when the light emitting element 60 is turned off, the MOSFETs 20a and 20b are turned off, and the output terminals 82a and 82b are electrically decoupled.

1.4 Manufacturing Method

Figure 5:
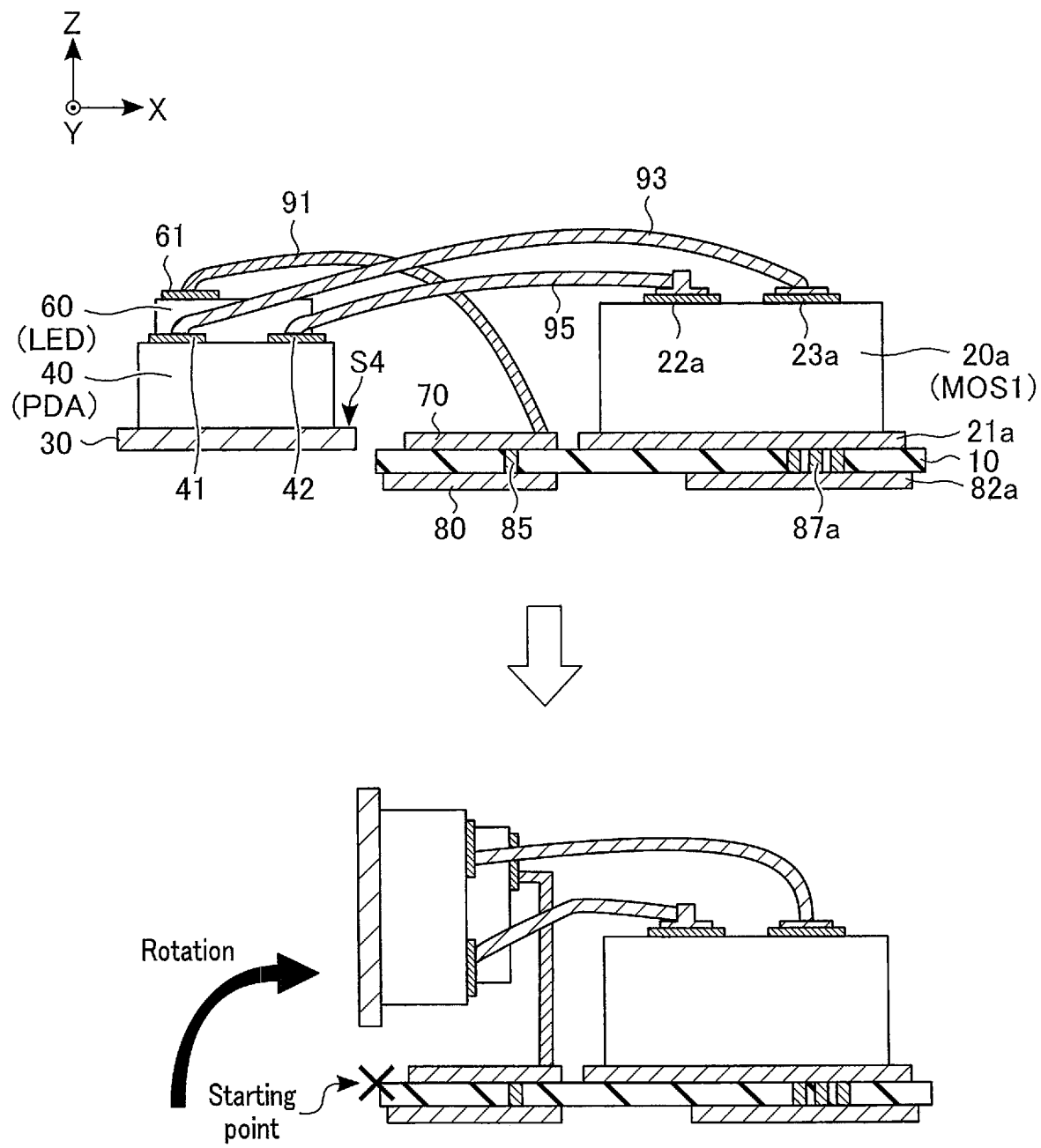
FIG. 5 is a diagram illustrating a process of disposing a light receiving element and a light emitting element in a longitudinal direction in the photo relay device according to the first embodiment.

Next, an example of a method for manufacturing the photo relay device 1 will be described with reference to FIG. 5. In the present embodiment, the description will be given focusing on a process of disposing the light receiving element 40 and the light emitting element 60 in the longitudinal direction. FIG. 5 is a diagram illustrating the process of disposing the light receiving element 40 and the light emitting element 60 in the longitudinal direction.

As illustrated in FIG. 5, for example, the stacked structure of the support base 30, the light receiving element 40, and the light emitting element 60 is disposed adjacent to the substrate 10 in a state where the surface S4 of the support base 30 faces the Z direction. In this state, the respective electrodes are electrically coupled. In the example of FIG. 5, the electrode 22a of the MOSFET 20a and the electrode 42 of the light receiving element 40 are electrically coupled via the wire 95. The electrode 23a of the MOSFET 20a and the electrode 41 of the light receiving element 40 are electrically coupled via the wire 93. The electrode 61 of the light emitting element 60 and the electrode 70 are electrically coupled via the wire 91. The same is applied to the other electrodes.

Next, for example, the stacked structure of the support base 30, the light receiving element 40, and the light emitting element 60 is rotated by 90 degrees with the end in the X direction of the substrate 10 as a starting point and is disposed in the longitudinal direction. Then, the MOSFETs 20a and 20b, the light receiving element 40, and the light emitting element 60 are covered with the sealing resin 100. Note that the method for disposing the light receiving element 40 and the light emitting element 60 in the longitudinal direction is not limited thereto.

1.5 Effects According to Present Embodiment

According to the configuration of the present embodiment, for example, transmission characteristics of a high-frequency signal of 1 GHz or more can be improved.

The present effects are described in detail.

For example, in the photo relay device, the light receiving element and the light emitting element may be disposed between the MOSFET (output terminal) and the electrode (input terminal). In this case, coupling capacitances are generated between the light receiving element and the input terminal and between the light receiving element and the output terminal. Due to the influence of the coupling capacitance, high-frequency transmission characteristics of, for example, 1 GHz or more may be deteriorated. In addition, for example, when the length of the wire coupling the light receiving element and the MOSFET increases, transmission characteristics are deteriorated in a lower frequency region due to the influence of the open stub.

On the other hand, according to the configuration of the present embodiment, in the photo relay device 1, the light receiving element 40 and the light emitting element 60 can be disposed in the longitudinal direction. As a result, the coupling capacitances generated between the light receiving element 40 and the input terminals 80 and 81 and between the light receiving element 40 and the output terminals 82a and 82b can be reduced. Furthermore, the coupling capacitance generated between the input terminal 80 and the input terminal 81 can be reduced. In addition, by disposing the light receiving element 40 and the light emitting element 60 in the longitudinal direction, the lengths of the wires coupling the electrode of the light receiving element 40 and the electrodes of the MOSFETs 20a and 20b can be relatively shortened. Similarly, the lengths of the wires coupled to the electrodes 61 and 62 of the light emitting element 60 and the electrodes 70 and 71 provided on the substrate 10 can be relatively shortened. Therefore, the influence of the open stub can be shifted to a higher frequency region. Therefore, the transmission characteristics of the high-frequency signal of the semiconductor device can be improved.

Furthermore, according to the configuration of the present embodiment, by disposing the light receiving element 40 and the light emitting element 60 in the longitudinal direction, an installation area of the photo relay device 1 can be reduced. That is, the photo relay device 1 can be downsized.

2. Second Embodiment

Next, a second embodiment will be described. In the second embodiment, a configuration of a photo relay device 1 different from that of the first embodiment will be described. Hereinafter, differences from the first embodiment will be mainly described.

2.1 Overall Configuration

Figure 6:
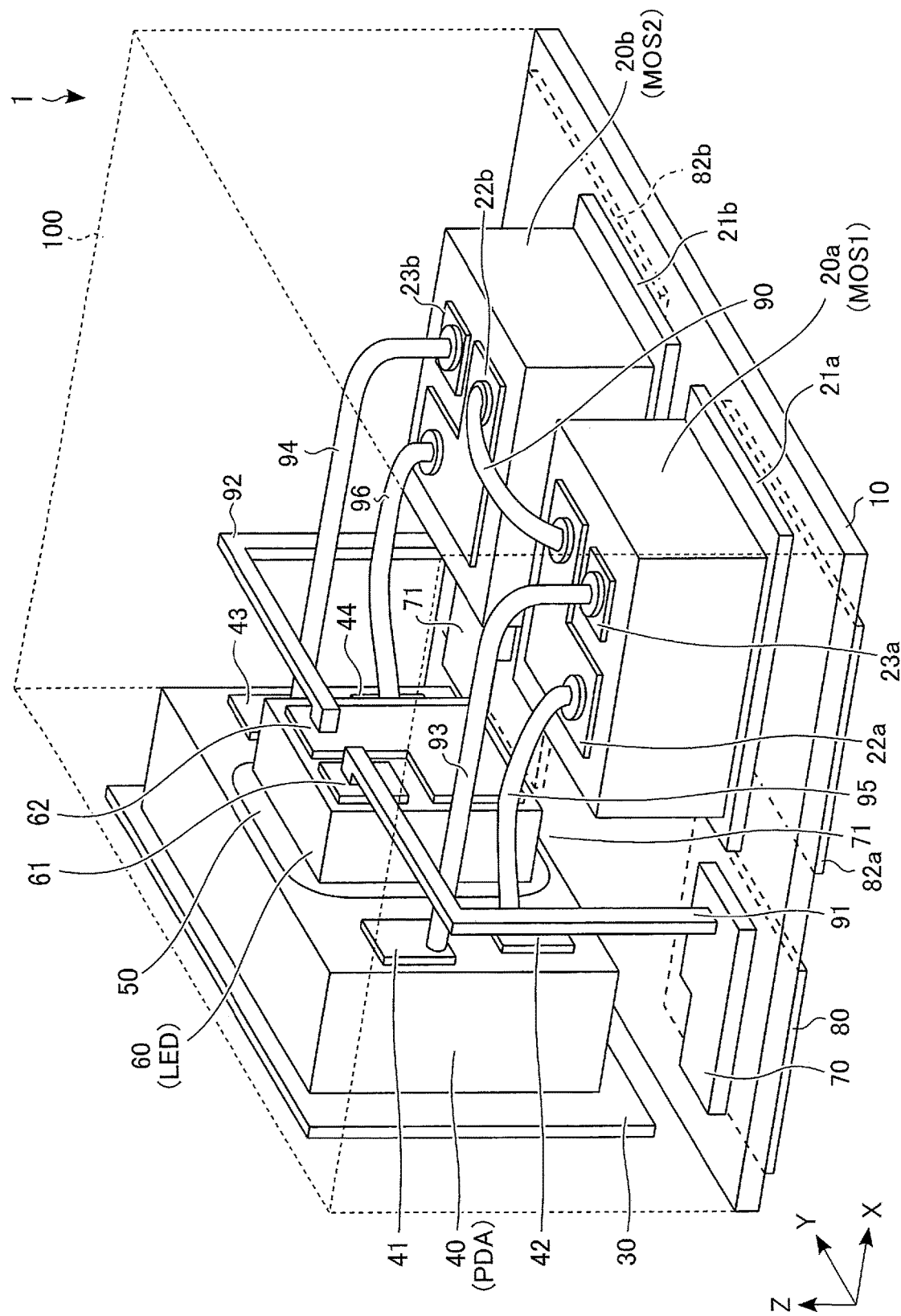
FIG. 6 is a perspective view of a photo relay device according to a second embodiment.
Figure 7:
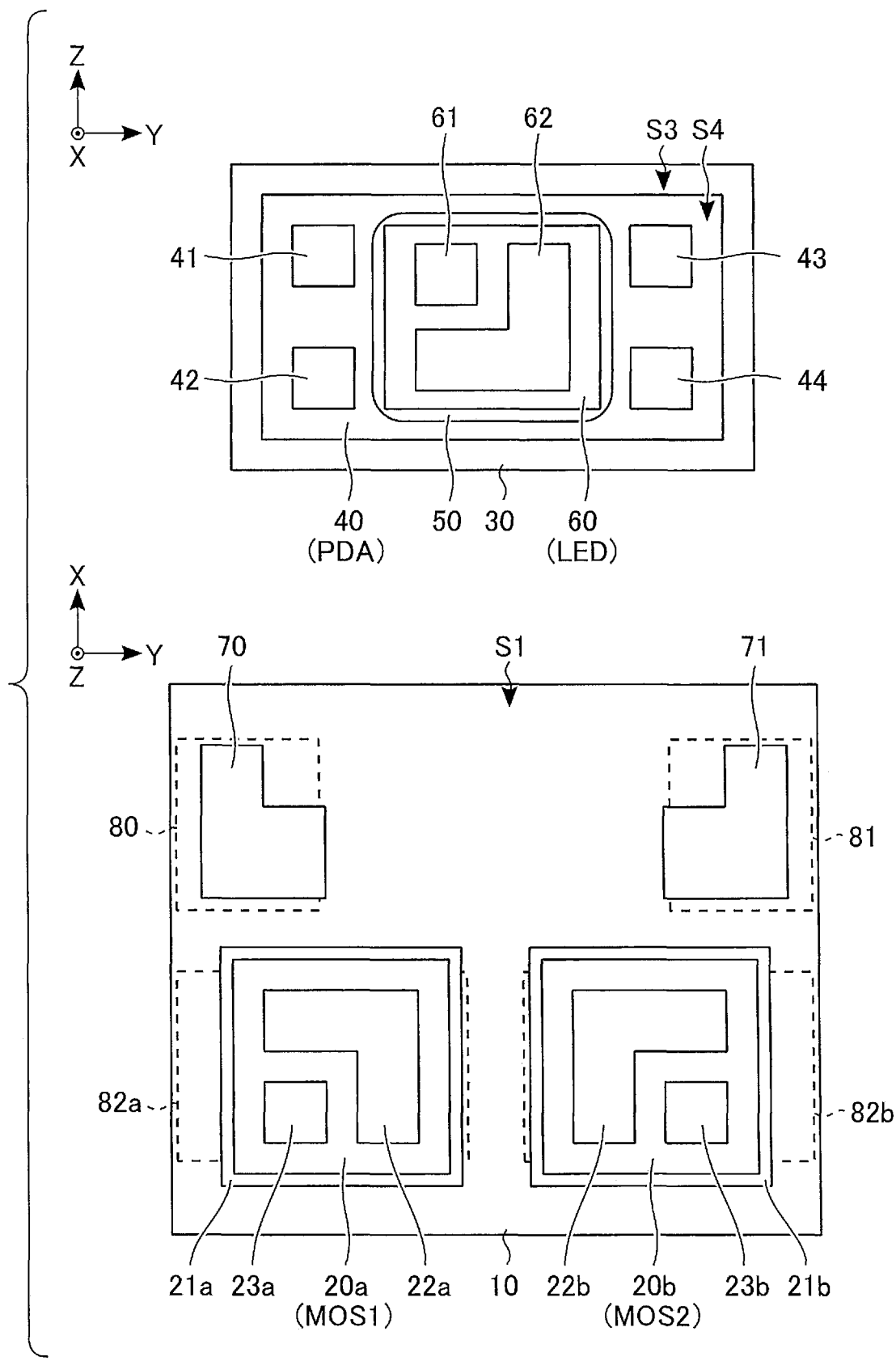
FIG. 7 is a diagram illustrating a plane of a substrate and a plane of a support base in the photo relay device according to the second embodiment.

An example of an overall configuration of the photo relay device 1 will be described with reference to FIGS. 6 and 7. FIG. 6 is a perspective view of the photo relay device 1. FIG. 7 is a diagram illustrating a plane of a substrate 10 and a plane of a support base 30 in the photo relay device 1. Note that, in FIG. 7, in order to simplify the description, wires coupling electrodes are omitted.

As illustrated in FIGS. 6 and 7, the arrangement of MOSFETs 20a and 20b, a light receiving element 40, and a light emitting element 60 of the photo relay device 1 according to the present embodiment is similar to that of FIG. 1 according to the first embodiment.

An electrode 70 of the present embodiment is disposed at an end portion of the substrate 10 rather than the MOSFET 20a in a Y direction, for example. Similarly, an electrode 71 is disposed at an end portion of the substrate 10 rather than the MOSFET 20b in the Y direction, for example.

Wires 91 and 92 are different in wire layout from the first embodiment. For example, the wire 91 extends in the Y direction from a coupling position with an electrode 61, and is bent toward the electrode 70 above the electrode 70. In addition, the wire 91 extends in a Z direction and is coupled to the electrode 70. Similarly, for example, the wire 92 extends in the Y direction from a coupling position with an electrode 62, and is bent toward the electrode 71 above the electrode 71. In addition, the wire 92 extends in the Z direction and is coupled to the electrode 71. As a result, in the Y direction, wires 93 to 96 extending in an X direction are disposed between the wire 91 and the wire 92.

2.2 Effects According to Present Embodiment

According to the configuration of the present embodiment, effects similar to those of the first embodiment can be obtained.

Furthermore, according to the configuration of the present embodiment, the distances between the wires 91 and 92 and the wires 93 to 96 can be relatively increased. Accordingly, electromagnetic interference between the wires can be reduced.

3. Others

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions.

The accompanying claims and their equivalents are intended to cover such forms or modifications as would fall within the scope and spirit of the inventions.

The invention claimed is:

1. A semiconductor device comprising:
   a substrate that has a first surface extending in a first direction and a second direction;
   a first metal oxide semiconductor field effect transistor (MOSFET) that is provided on the first surface of the substrate;
   a support base that is provided above the first surface of the substrate and extends in a third direction intersecting the first direction and the second direction;
   a light receiving surface of a light receiving element that is oriented in the first direction; and
   a light emitting element that is in contact with a third surface of the light receiving element facing the first direction.

2. The semiconductor device according to claim 1, wherein
   the second surface and the third surface face a side where the first MOSFET is disposed in the first direction.

3. The semiconductor device according to claim 1, wherein
   the light receiving surface of the light receiving element is provided on the third surface, and
   an irradiation surface of the light emitting element faces the light receiving surface.

4. The semiconductor device according to claim 1, wherein
   the first MOSFET includes a first electrode and a second electrode,
   the light receiving element includes a third electrode and a fourth electrode,
   the first electrode and the third electrode are electrically coupled, and
   the second electrode and the fourth electrode are electrically coupled.

5. The semiconductor device according to claim 1, further comprising:
   a second MOSFET that is provided on the first surface, wherein
   a source of the first MOSFET and a source of the second MOSFET are electrically coupled.

6. The semiconductor device according to claim 1, further comprising:
   a fifth electrode that is provided on the first surface, wherein
   the light emitting element includes a sixth electrode, and
   the fifth electrode and the sixth electrode are electrically coupled.

7. The semiconductor device according to claim 6, wherein
   the sixth electrode is provided on a fifth surface of the light emitting element facing the first direction.

8. The semiconductor device according to claim 4, further comprising:
   a second MOSFET that is provided on the first surface, wherein
   the second MOSFET includes a fifth electrode and a sixth electrode,
   the light receiving element further includes a seventh electrode and an eighth electrode,
   the fifth electrode and the seventh electrode are electrically coupled, the sixth electrode and the eighth electrode are electrically coupled, and the first electrode and the fifth electrode are electrically coupled.

9. The semiconductor device according to claim 1, wherein when the light receiving element receives light from the light emitting element, the light receiving element turns on the first MOSFET.

10. The semiconductor device according to claim 8, wherein when the light receiving element receives light from the light emitting element, the light receiving element turns on the first MOSFET and the second MOSFET, and a signal is transmitted via the first MOSFET and the second MOSFET.

11. The semiconductor device according to claim 8, wherein the first electrode is coupled to a source of the first MOSFET, the second electrode is coupled to a gate of the first MOSFET, the fifth electrode is coupled to a source of the second MOSFET, and the sixth electrode is coupled to a gate of the second MOSFET.

12. The semiconductor device according to claim 1, wherein the second surface and the third surface face a side surface of the first MOSFET in the first direction.

13. The semiconductor device according to claim 4, wherein the first electrode and the second electrode are provided on a fourth surface of the first MOSFET facing the third direction.

\* \* \* \* \*